(12) United States Patent
Lee (10) Patent No.: US 8,201,034 B2
(45) Date of Patent: Jun. 12, 2012

(54) MEMORY DEVICE AND RELATED TESTING METHOD

(75) Inventor: Yu-Chin Lee, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 747 days.

(21) Appl. No.: 11/836,791

(22) Filed: Aug. 10, 2007

(65) Prior Publication Data

US 2008/0215938 A1 Sep. 4, 2008

(30) Foreign Application Priority Data

Mar. 3, 2007 (TW) .............................. 96107388 A (51) Int. Cl.
*G11C 29/00* (2006.01)
(52) U.S. Cl. ........................................................ 714/719
(58) Field of Classification Search .................. 714/733, 714/726, 724, 718, 719, 727, 732, 736, 738, 714/734; 365/200, 201
See application file for complete search history.

(56) References Cited

U.S. PATENT DOCUMENTS

| | | | | |
|---|---|---|---|---|
| 5,377,148 A | * | 12/1994 | Rajsuman | 365/201 |
| 5,621,883 A | * | 4/1997 | Thoulon et al. | 714/5.11 |
| 5,930,814 A | * | 7/1999 | Lepejian et al. | 711/1 |
| 6,907,555 B1 | * | 6/2005 | Nomura et al. | 714/719 |
| 6,914,834 B2 | * | 7/2005 | Mayer | 365/201 |
| 7,139,204 B1 | * | 11/2006 | Behera | 365/201 |
| 2005/0166097 A1 | | 7/2005 | An | |
| 2006/0215470 A1 | | 9/2006 | Santin | |
| 2010/0324854 A1 | * | 12/2010 | Resnick et al. | 702/108 |

FOREIGN PATENT DOCUMENTS

| | | |
|---|---|---|
| TW | 594774 | 6/2004 |
| TW | 200629284 | 8/2006 |

* cited by examiner

*Primary Examiner* — Ajay Bhatia
*Assistant Examiner* — Daniel McMahon
(74) *Attorney, Agent, or Firm* — Winston Hsu; Scott Margo (57) ABSTRACT

A method for testing a memory device is disclosed. The method includes: respectively writing at least one test data into a plurality of storage blocks in the memory device such that a plurality of first time written test data are stored in the storage blocks; in a read with write back test mode, reading the first time written test data from the storage blocks in the memory device and writing the plurality of first time written test data into the storage blocks to generate a plurality of second time written test data; and in a compress test mode, reading the plurality of second time written test data from the storage blocks by a compress test operation and determining whether the memory device operates erroneously according to the plurality of second time written test data and the test data.

4 Claims, 6 Drawing Sheets

MEMORY DEVICE AND RELATED TESTING METHOD

BACKGROUND OF THE INVENTION

1. Field of the Invention

The present invention relates to a scheme for testing a memory device, and more particularly, to a memory device having a compress test operation and method thereof.

2. Description of the Prior Art

In general, a memory device has many electronic PADs, where data can be written to or read from the memory device via each electronic PAD. As regards an external stress equipment for testing the memory device, it is necessary to test all elements and a storage block on a data read path (or a data write path) corresponding to each electronic PAD, to guarantee that internal elements within the memory device can operate correctly. The stress equipment often writes a test data into the storage block through the data write path and then reads the written test data from the storage block through the data read path. Therefore, if the written test data read from the storage block is detected to be different from the original test data, this means that an error arises in internal element(s) with the memory device.

Figure 1:
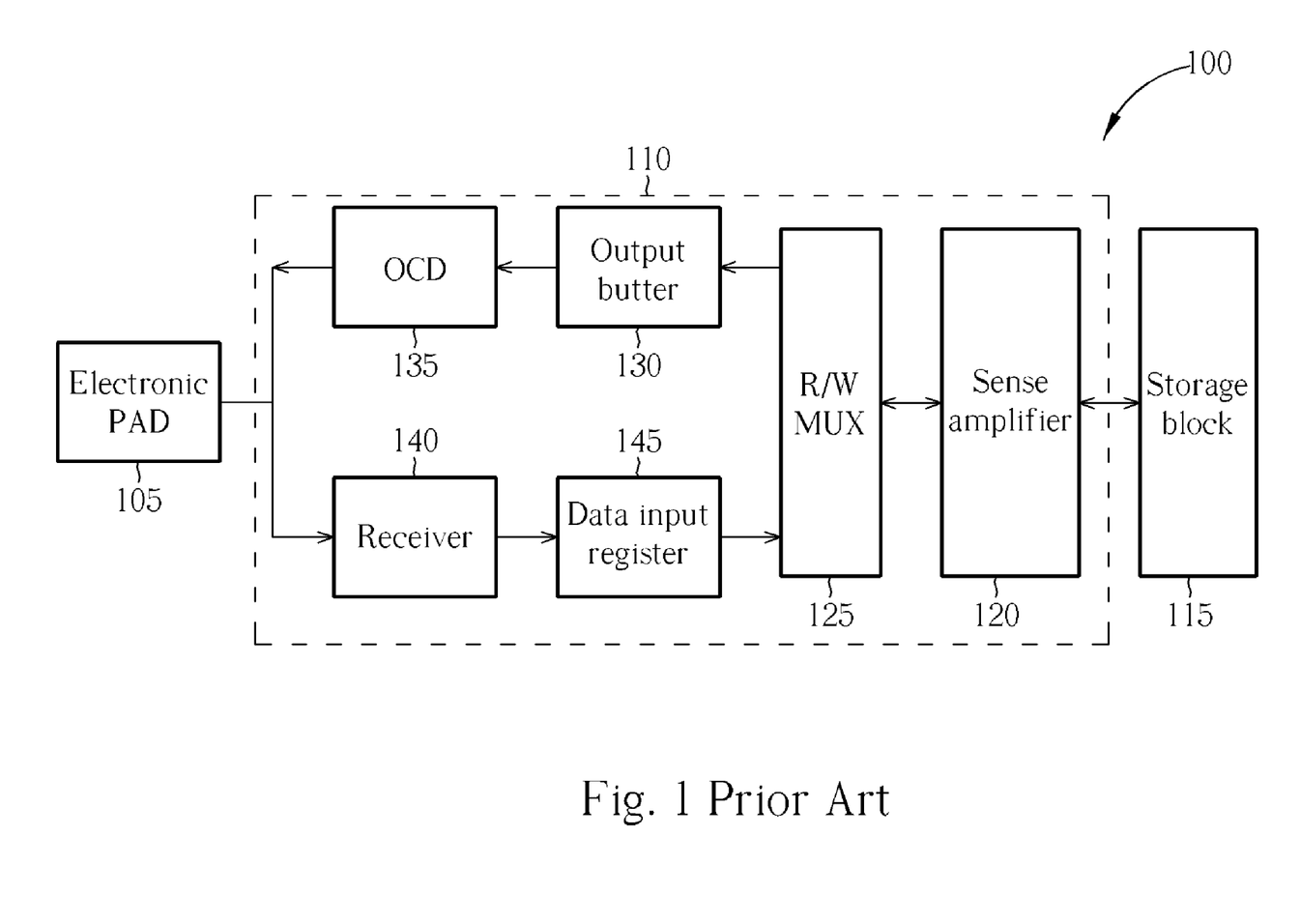
FIG. 1 is a simplified diagram of a conventional memory device including an electronic PAD, a reading and writing circuit, and a storage block.

Please refer to FIG. 1. FIG. 1 is a simplified diagram of a conventional memory device 100 including an electronic PAD 105, a reading and writing circuit 110, and a storage block 115. As shown in FIG. 1, the reading and writing circuit 110 includes a sense amplifier 120, an read/write multiplexer (R/W MUX) 125, an output buffer 130, an off chip driver (OCD) 135, a receiver 140, and a data input register 145. The memory device 100 may further include another sense amplifier (not shown in FIG. 1) positioned between the storage block 115 and the sense amplifier 120. A data read path within the reading and writing circuit 110 is composed of the sense amplifier 120, the R/W MUX 125, the output buffer 130, and the OCD 135; a data write path within the reading and writing circuit 110 is composed of the receiver 140, the data input register 145, the R/W MUX 125, and the sense amplifier 120. For reading data from the memory device 110, the above-mentioned other sense amplifier and the sense amplifier 120 are both utilized for sensing a voltage difference or current difference from a storage cell in the storage block 115 and for amplifying the voltage difference or current difference to output a high voltage level (e.g. 1 V) representative of bit '1' or a low voltage level (e.g. zero) representative of bit '0'. At this time, the R/W MUX 125 transmits a signal outputted by the sense amplifier 120 into the output buffer 130; the output buffer 130 then buffers the signal transmitted by the R/W MUX 125 and then outputs the buffered signal into the OCD 135 by a specific queuing scheme (e.g. a first in first out (FIFO) queuing scheme). The OCD 135 adjusts a voltage level of the buffered signal outputted by the output buffer 130 for improving signal quality of a signal finally transmitted to the electronic PAD 105. Accordingly, an external circuit can estimate the data read from the memory device 100 at bit '1' or bit '0' by a voltage level of a signal at the electronic PAD 105. In addition, for writing data into the memory device 100, the receiver 140 is utilized for receiving a signal at the electronic PAD 105 and then outputting the received signal into the data input register 145, which transmits the registered signal into the R/W MUX 125. The R/W MUX 125 outputs the signal transmitted by the data input register 145 into the storage cell in the storage block 115 via the sense amplifier 120 and the above-mentioned other sense amplifier. Therefore, data representative of the signal can be stored in the storage cell.

As described above, when testing the storage block 115 and the data read/write path of the reading and writing circuit 110, the stress equipment also writes the test data into the storage block 115 through the above-mentioned data write path and then reads the written test data from the storage block 115 through the above-mentioned data read path. The test data read from the memory device 100 and the original test data are continuously compared to determine whether an error arises in the internal element(s) within the memory device 100. However, considering the cost of the stress equipment (the cost will become much higher if a number of required test channels are increased by a large amount) and efficiency when testing the memory device 100, the stress equipment may obtain test results with respect to various reading and writing circuits and storage blocks corresponding to various electronic PADs utilizing a single electronic PAD. Consequently, a hardware designer often adds a test circuit into a memory device, where in a compress test mode the test circuit is utilized for comparing different test data (that are transmitted by the reading and writing circuits and the storage blocks corresponding to the electronic PADs) with an original test data to generate a test result (pass or fail) into the single electronic PAD. The stress equipment can therefore obtain the test results with respect to the reading and writing circuits and the storage blocks only utilizing the single electronic PAD. Ideally, by the added test circuit mentioned above, the reading and writing circuits and the storage blocks corresponding to the various electronic PADs can be detected; however, in practice, the test circuit can never detect all elements within the reading and writing circuits corresponding to the electronic PADs (that is, some elements may not be detected) with the result that an error may arise in a particular element within the memory device although the stress equipment obtains a pass test result. If this situation occurs frequently, a yield with regards to products manufactured according to this memory device will be reduced significantly.

SUMMARY OF THE INVENTION

It is therefore one of the objectives of the present invention to provide a memory device having a compress test mode and a read with write back test mode and method thereof, to solve the above-mentioned problems.

According to an embodiment of the present invention, a method for testing a memory device is disclosed. The method comprises: respectively writing at least a test data into a plurality of storage blocks in the memory device so that the storage blocks respectively store a plurality of first time written test data; in a read with write back test mode, reading the plurality of first time written test data from the storage blocks in the memory device respectively and then writing the plurality of first time written test data into the storage blocks to generate a plurality of second time written test data; and in a compress test mode, reading the second time written test data from the storage blocks by a compress test operation and determining whether an error arises in the memory device according to the second time written test data and the test data.

According to the embodiment of the present invention, a memory device is disclosed. The memory device comprises a first storage block, a first PAD, a first reading and writing circuit, a second storage block, a second PAD, a second reading and writing circuit, a test circuit, and a control circuit. The first reading and writing circuit, including a first data read path and a first data write path, is coupled to the first storage block and the first PAD and is utilized for reading data from the first storage block or writing data into the first storage block. The second reading and writing circuit, including a second data read path and a second data write path, is coupled to the second storage block and the second PAD and is utilized for reading data from the second storage block or writing data into the second storage block. The test circuit is coupled to the first reading and writing circuit and the second reading and writing circuit, and the test circuit is utilized for determining whether an error arises in the memory device. The control circuit is coupled to the first reading and writing circuit and the second reading and writing circuit, and the control circuit is utilized for respectively controlling the first and second data read paths to selectively transmit data read from the first and second storage blocks into the test circuit or the first and second PADs. The control circuit is further utilized for respectively controlling the first and second data write paths to selectively write the test data or data from the first and second PADs into the first and second storage blocks. In addition, the first and second PADs or the test circuit write at least a test data into the first and second storage blocks through the first and second data write paths respectively so that the first and second storage blocks respectively store a plurality of first time written test data. The plurality of first time written test data includes a first writing test data and a second writing test data corresponding to the first storage block and the second storage block respectively. When the memory device switches to a read with write back test mode, the control circuit controls the first and second data read paths to respectively read the first writing test data and the second writing test data from the first storage block and the second storage block. The control circuit further controls the first and second data write paths to respectively write the first writing test data and the second writing test data into the first storage block and the second storage block through the first and second data write paths to generate a plurality of second time written test data. The plurality of second time written test data includes a third writing test data and a fourth writing test data corresponding to the first and second storage blocks respectively. When the memory device switches to a compress test mode, the control circuit controls the first and second data read paths to read the third and fourth writing test data from the first and second storage blocks and then transmits the third and fourth writing test data into the test circuit. The test circuit performs a compress test operation to determine whether an error arises in the memory device according to the third and fourth writing test data and the test data.

These and other objectives of the present invention will no doubt become obvious to those of ordinary skill in the art after reading the following detailed description of the preferred embodiment that is illustrated in the various figures and drawings.

DETAILED DESCRIPTION

Compared with the conventional memory device 100 shown in FIG. 1, a memory device disclosed in an embodiment of the present invention writes at least a test data into a plurality of storage blocks through a plurality of data write paths in a compress test mode, where the test data can be generated by a test circuit or can be inputted to the memory device from an external stress equipment. When the memory device switches from the compress test mode to a read with write back test mode, the written test data is read from the memory device and the data read from the memory device is then written into the storage blocks again (this can be performed at least one time). The test circuit is utilized for comparing the test data finally read from the memory device with the original test data to see whether the finally read test data is different from the original test data, for determining whether an error arises in the memory device. By the above-mentioned read with write back test mode, it can be ensured that all elements and electronic lines used for accessing the memory device are checked. A complete description is detailed in a following section.

Figure 2:
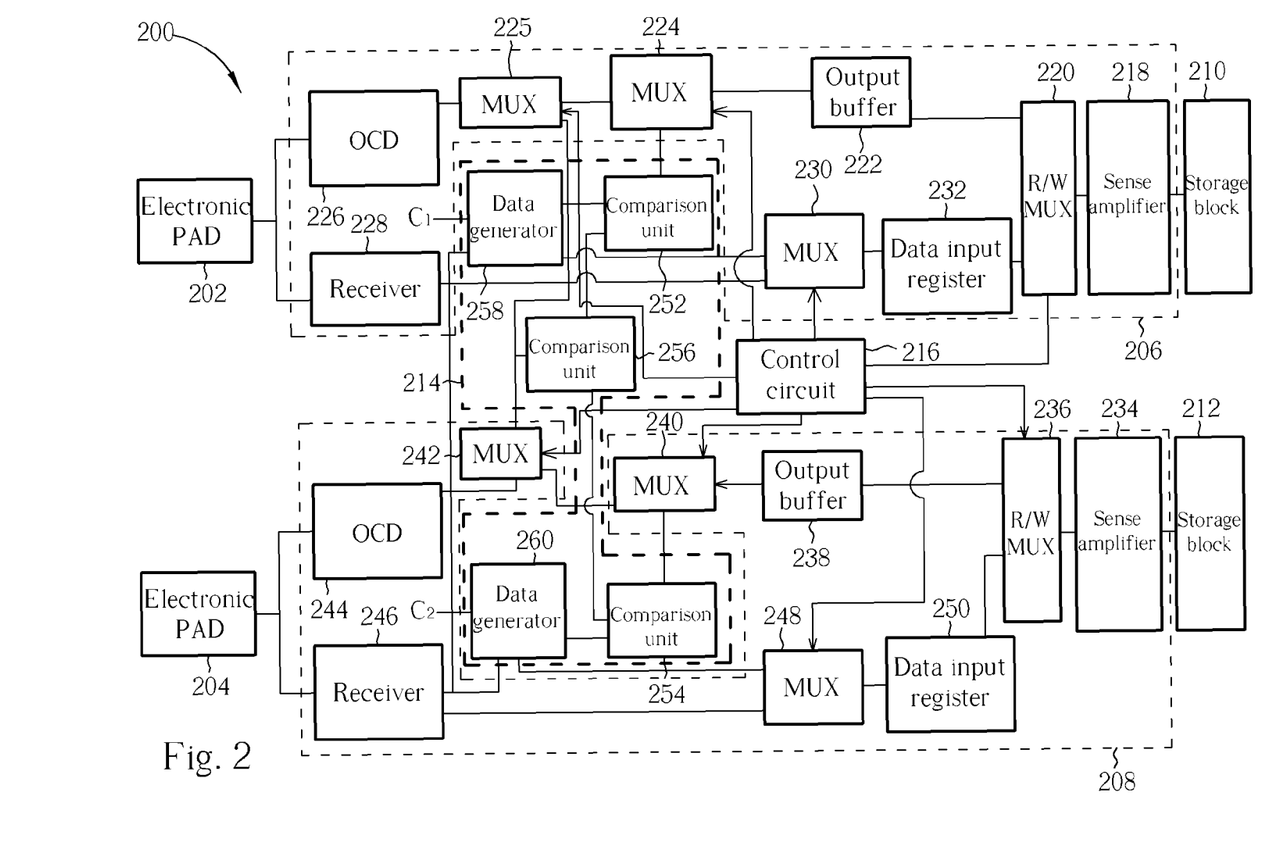
FIG. 2 is a simplified diagram of a memory device according to an embodiment of the present invention.

Please refer to FIG. 2. FIG. 2 is a simplified diagram of a memory device 200 according to an embodiment of the present invention. As shown in FIG. 2, the memory device 200 includes electronic PADs 202 and 204, reading and writing circuits 206 and 208, storage blocks 210 and 212, a test circuit 214, and a control circuit 216. Although only the electronic PADs 202 and 204, the reading and writing circuits 206 and 208, and the storage blocks 210 and 212 are shown in FIG. 2, this is not intended to be a limitation of the present invention. In practice, the memory device 200 can include many electronic PADs, reading and writing circuits, and storage blocks. As shown in this figure, a data read path of the reading and writing circuit 206 is composed of a sense amplifier 218, an R/W MUX 220, an output buffer 222, MUXs 224 and 225, and an OCD 226; a data write path of the reading and writing circuit 206 is composed of a receiver 228, a MUX 230, a data input register 232, the R/W MUX 220, and the sense amplifier 218. Similarly, a data read path of the reading and writing circuit 208 is formed with a sense amplifier 234, an R/W MUX 236, an output buffer 238, MUXs 240 and 242, and an OCD 244 in the reading and writing circuit 208; a data write path of the reading and writing circuit 208 is formed with a receiver 246, a MUX 248, a data input register 250, the R/W MUX 236, and the sense amplifier 234. It should be noted that function and operation of the sense amplifiers 218 and 234, the R/W MUXs 220 and 236, the output buffers 222 and 238, the OCDs 226 and 244, the receivers 228 and 246, and the data input registers 232 and 250 are respectively identical to that of the sense amplifier 120, the R/W MUX 125, the output buffer 130, the OCD 135, the receiver 140, and the data input register 145 shown in FIG. 1; therefore corresponding descriptions are not detailed here for brevity. As mentioned above, when data stored in the storage blocks 210 and 220 is read from the memory device 200 in a normal data read mode, this data is read through the above-mentioned data read paths in the reading and writing circuits 206 and 208. The control circuit 216 controls the MUXs 224 and 240 to transmit data received from the output buffers 222 and 238 into the MUXs 225 and 242 respectively and then controls the MUXs 225 and 242 to selectively receive data outputted from the MUXs 224 and 240 instead of receiving data outputted from the comparison unit 256, for transmitting the received data to the OCDs 226 and 244. Accordingly, the above-mentioned data can be read from the OCDs 226 and 244 through the electronic PADs 202 and 204 respectively. Otherwise, when data is written into the storage blocks 210 and 212 in a normal data write mode, the data is written into the storage blocks 210 and 212 through the data write paths in the reading and writing circuits 206 and 208 respectively. The control circuit 216 controls the MUXs 230 and 248 to receive data outputted from the receivers 228 and 246 and then outputs the data into the data input registers 232 and 250 respectively. The test circuit 214 includes a plurality of comparison units 252, 254, and 256, and a plurality of data generators 258 and 260. The test circuit 214 is utilized for generating at least a test data to output the test data into elements within the memory device 200 and for comparing data finally read by the test circuit 214 itself with the test data originally generated by the test data 214 itself to determine whether the final read data is different from the originally generated test data, in order to decide whether an error arises in the memory device 200. The control circuit 216 is utilized for controlling the MUXs 230, 248/242, and 225 to receive data generated by the test circuit 214 or controlling the MUXs 224 and 240 to output data into the test circuit 214 when the memory device 200 switches to a compress test mode. When the memory device 200 switches to a read with write back test mode, the control circuit 216 is also utilized for controlling the MUXs 240 and 224 to output data into the MUXs 242 and 225 and the OCDs 244 and 226 respectively, for controlling the MUXs 230 and 248 to receive data outputted from the receivers 228 and 246, and for controlling the MUXs 242 and 225 to receive data outputted from the MUXs 240 and 224.

Figure 3:
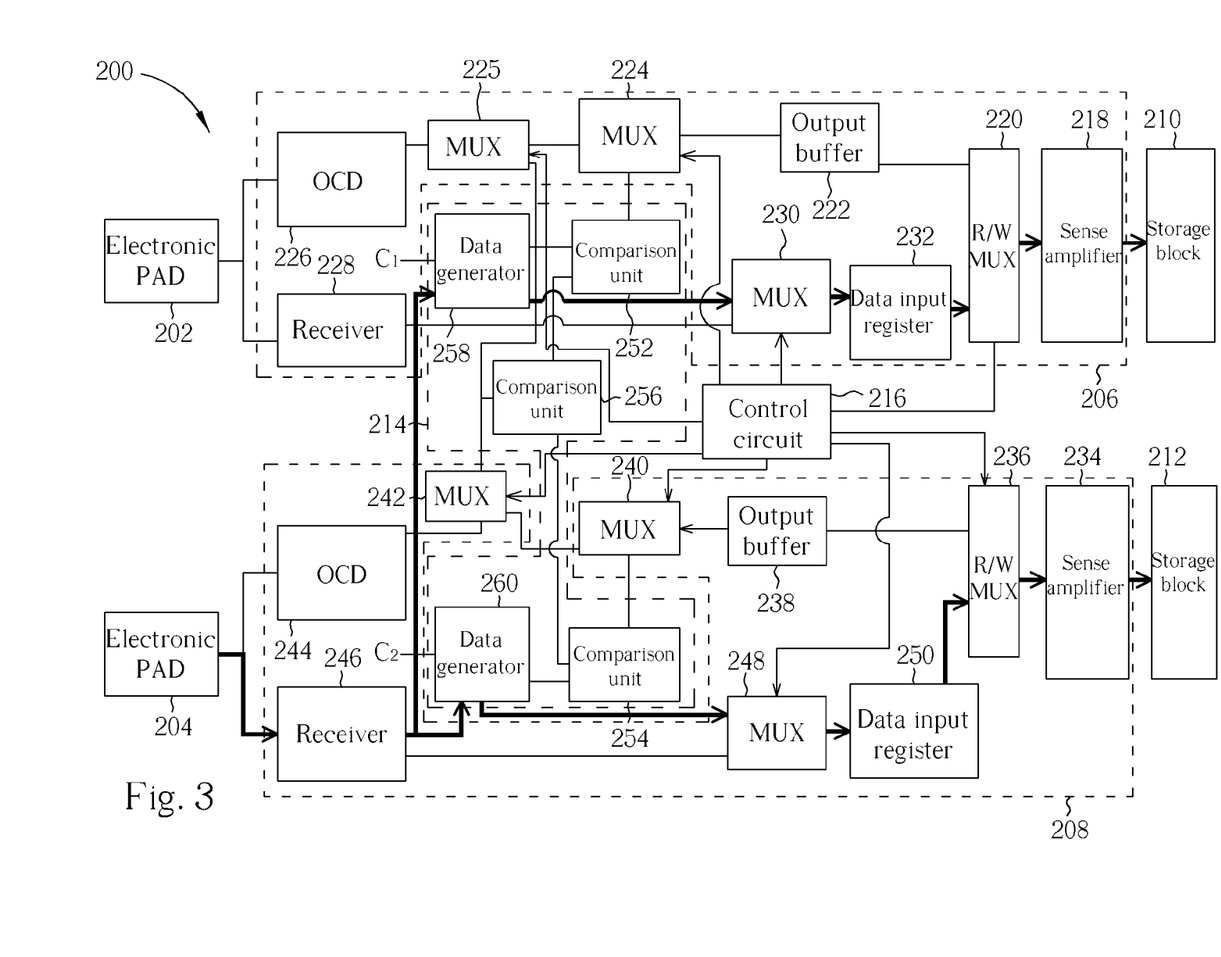
FIG. 3 is a diagram illustrating an operation of the memory device shown in FIG. 2 of writing a test data into the storage blocks in the compress test mode.
Figure 4:
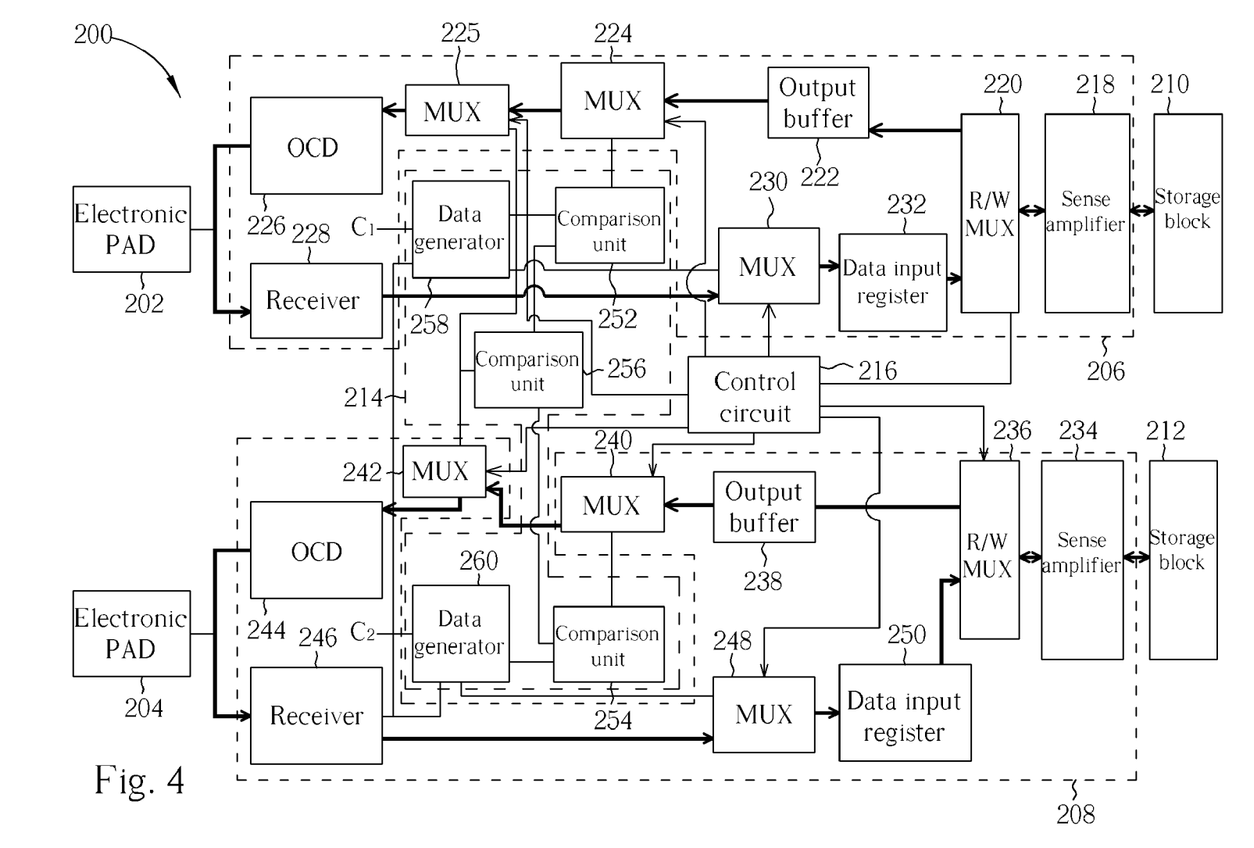
FIG. 4 is a diagram illustrating the operation of the memory device shown in FIG. 2 of reading data through the data read paths and writing the data into the storage blocks through the data write paths in the read with write back test mode.
Figure 5:
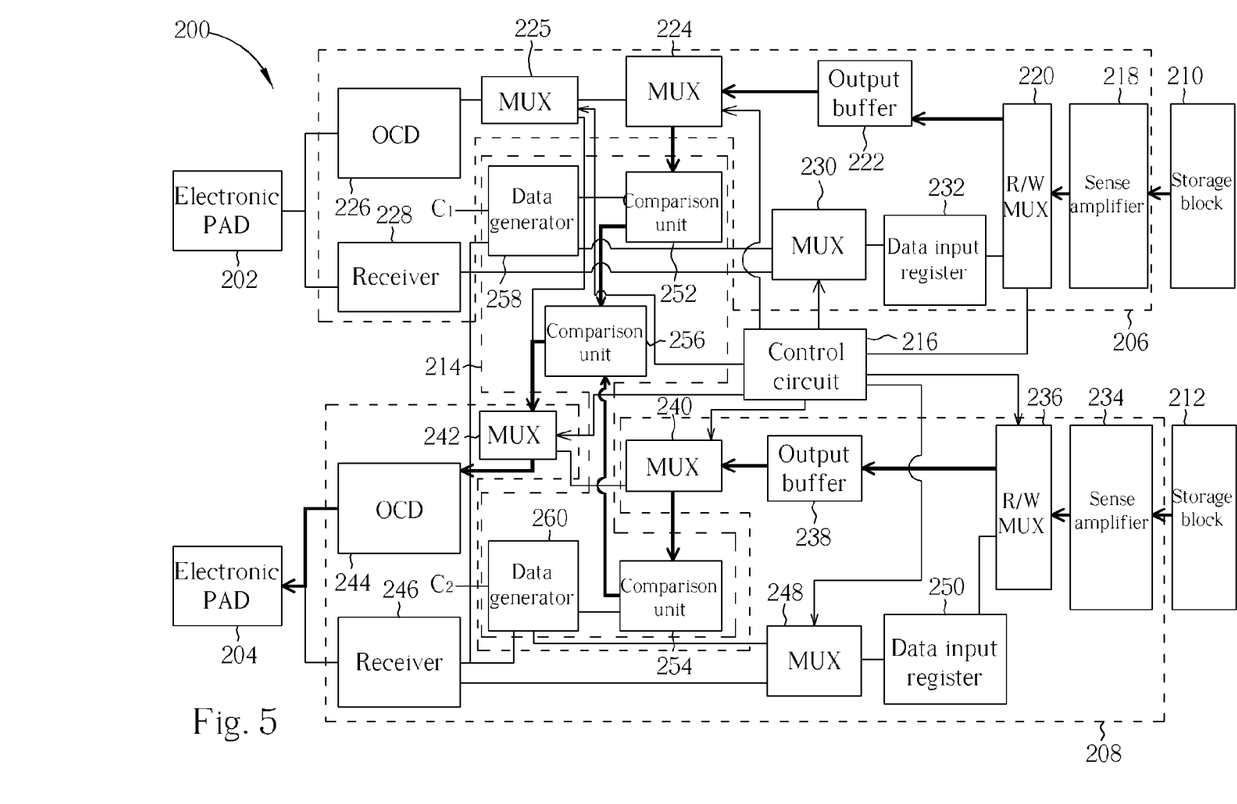
FIG. 5 is a diagram showing the operation of the memory device shown in FIG. 2 of reading the data stored in the storage blocks in the compress test mode.

In this embodiment, a description of testing the memory device 200 is detailed in the following. Please refer to FIG. 3~FIG. 5. FIG. 3 is a diagram illustrating an operation of the memory device 200 shown in FIG. 2 of writing a test data into the storage blocks 210 and 212 in the compress test mode. FIG. 4 is a diagram illustrating the operation of the memory device 200 shown in FIG. 2 of reading data through the data read paths and writing the data into the storage blocks 210 and 212 through the data write paths in the read with write back test mode. FIG. 5 is a diagram showing the operation of the memory device 200 shown in FIG. 2 of reading the data stored in the storage blocks 210 and 212 in the compress test mode. When testing of the memory device 200 is started, the memory device 200 first enters the compress test mode. As shown by boldface lines in FIG. 3, the stress equipment performs the compress test operation to input a command via the electronic PAD 204 and the receiver 246 to control the data generators 258 and 260 to generate test data $D_1$ and $D_2$ according to test data control settings $C_1$ and $C_2$, where the test data control settings $C_1$ and $C_2$ can be identical or different control settings. The test data $D_1$ and $D_2$ are respectively written into the storage blocks 210 and 212 through the MUXs 230 and 248, the data input registers 232 and 250, the R/W MUXs 220 and 236, and the sense amplifiers 218 and 234 so that a plurality of first time written test data $D_1'$ and $D_2'$ can be generated and stored in the storage blocks 210 and 212. That is, the control circuit 216 controls the MUXs 230 and 248 to receive the test data $D_1$ and $D_2$ generated by the data generators 258 and 260 respectively; the control circuit 216 also controls the R/W MUXs 220 and 236 to receive data registered in the data input registers 232 and 250 respectively and then outputs the received data into the sense amplifiers 218 and 234. Next, when the memory device 200 suspends the compress test operation to switch to the read with write back test mode, the first time written test data $D_1'$ and $D_2'$ is read from the storage blocks 210 and 212 through the sense amplifiers 218 and 234, the R/W MUXs 220 and 236, the output buffers 222 and 238, the MUXs 224 and 240, the MUXs 225 and 242, and the OCDs 226 and 244 on the data read paths respectively (as shown by boldface lines in FIG. 4). The first time written test data $D_1'$ and $D_2'$ read above is then written into the storage blocks 210 and 212 respectively through the receivers 228 and 246, the MUXs 230 and 248, the data input registers 232 and 250, the R/W MUXs 220 and 236, and the sense amplifiers 218 and 234 on the data write paths so that a plurality of second time written test data $D_1''$ and $D_2''$ is generated and stored in the storage blocks 210 and 212. At this time, the control circuit 216 controls the R/W MUXs 220 and 236 to output data received from the sense amplifiers 218 and 234 into the output buffers 222 and 238 respectively; the control circuit 216 also controls the MUXs 224 and 240 to output data received from the output buffers 222 and 238 into the MUXs 225 and 242 and then controls the MUXs 225 and 242 to selectively receive the data outputted by the MUXs 224 and 240, for transmitting the received data into the OCDs 226 and 244 respectively. In addition, when writing data into the memory device 200, the control circuit 216 controls the MUXs 230 and 248 to receive data outputted by the receivers 228 and 246 and also controls the R/W MUXs 220 and 236 to output data received from the data input registers 232 and 250 to the sense amplifiers 218 and 234 respectively.

Finally, when the second time written test data $D_1''$ and $D_2''$ is generated in the storage blocks 210 and 212, the memory device 200 switches to the compress test mode from the read with write back test mode for obtaining a test result by the test circuit 214 (as shown by boldface lines in FIG. 5). At this time, the control circuit 216 firstly controls the R/W MUXs 220 and 236 to transmit data outputted by the sense amplifiers 218 and 234 to the output buffers 222 and 238 and also controls the MUXs 224 and 240 to respectively transmit data outputted from the output buffers 222 and 238 to the comparison units 252 and 254 in the test circuit 214. The comparison units 252 and 254 compare the second time written test data $D_1''$ and $D_2''$ with the test data $D_1$ and $D_2$ originally generated by the data generators 258 and 260, to determine whether the second time written test data $D_1''/D_2''$ is different from the test data $D_1/D_2$ for deciding that the obtained test result is a pass test result or a fail test result. For example, if the test data $D_1$ and $D_2$ is configured as bit '1', the comparison units 252 and 254 can both be implemented by exclusive NOR gates. In other words, the comparison units 252/254 can detect that the test data $D_1$ and $D_2$ have been changed and therefore can output a bit '0' representative of a fail test result into the comparison unit 256 as long as either the test data $D_1$ or $D_2$ becomes bit '0' due to an error arising in the internal elements within the memory device 200. In the above example, the comparison unit 256 can be implemented by using an AND gate, and thus a bit '0' representative of a fail test result is outputted into the MUX 242 if the comparison unit 256 obtains a fail test result outputted by the comparison unit 252 or 254. The control circuit 216 controls the MUX 242 to receive data from the comparison unit 256 and the received data is then outputted to the electronic PAD 204 through the OCD 244. Therefore, the stress equipment can access data at the electronic PAD 204 to determine whether the test result outputted from the test circuit 214 is a pass test result, for determining whether an error arises in internal elements or electronic lines within the memory device 200.

As described above, in this embodiment, since the first time written test data $D_1'$ and $D_2'$ is read through the data read paths in the read with write back test mode and then written into the storage blocks 210 and 212 through the data write paths, elements and electronic lines that are unable to be detected in the compress test mode can be detected in the read with write back test mode. For instance, in the read with write back test mode, the OCD 226, the receiver 228, the MUX 225, an electronic line between the MUXs 224 and 225, an electronic line between the MUX 225 and the OCD 226, an electronic line between the receiver 228 and the MUX 230, an electronic line between the MUXs 240 and 242, an electronic line between the MUX 242 and the OCD 244, and an electronic line between the receiver 246 and the MUX 248 can be detected. These elements and electronic lines, which are unable to be detected in the compress test mode, are necessary for accessing the memory device 200 in the normal data read/write mode; these elements and electronic lines will be detected in the read with write back test mode provided by the embodiment of the present invention. The yield with respect to products manufactured according to the memory device 200 will therefore be increased.

Figure 6:
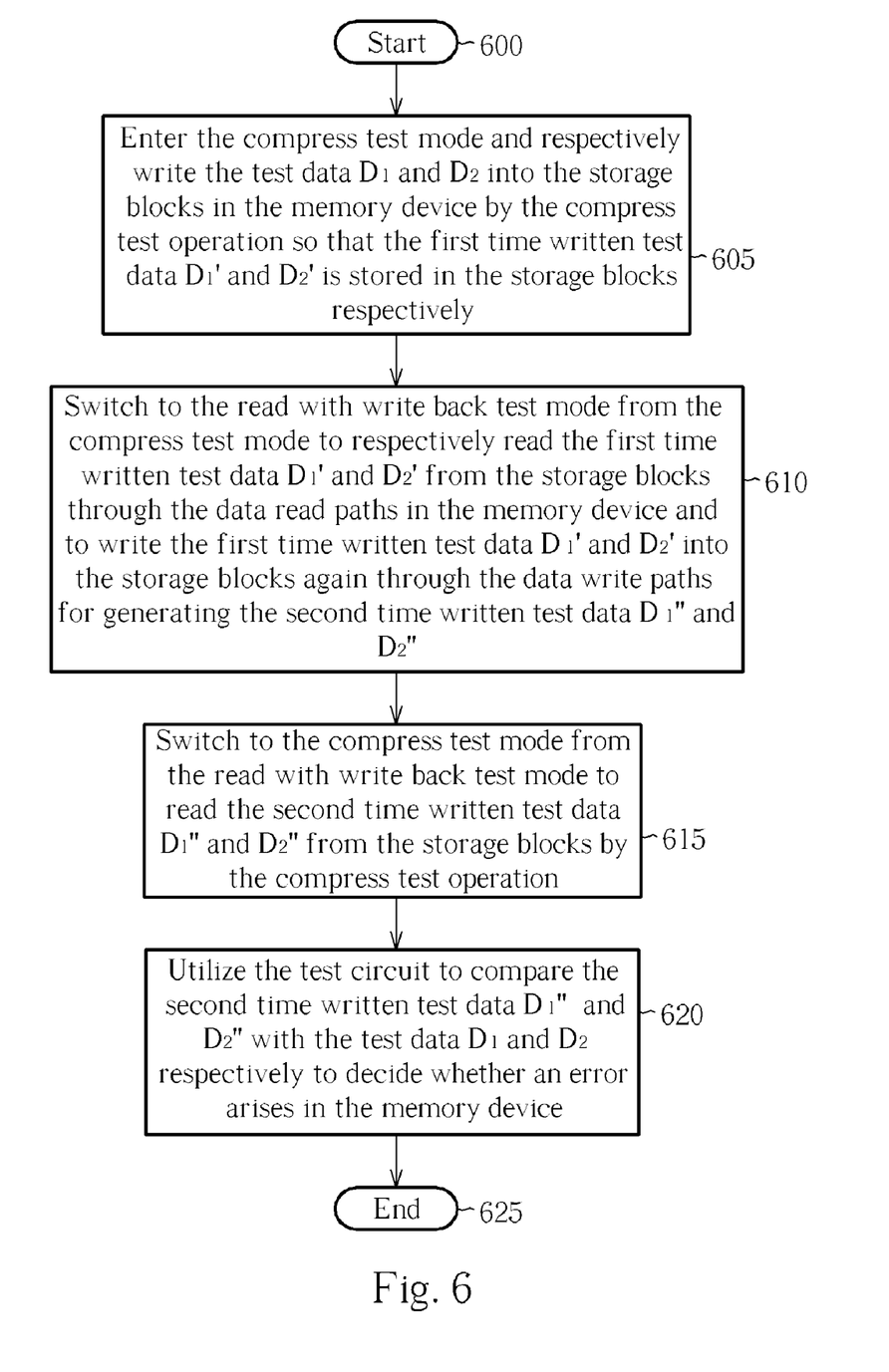
FIG. 6 is a simplified flowchart for testing the memory device shown in FIG. 2.

Additionally, in order to describe the spirit of the present invention more clearly, a flowchart illustrating the operation of the memory device 200 is detailed here as an explicit description for readers. Please refer to FIG. 6. FIG. 6 is a simplified flowchart for testing the memory device 200 shown in FIG. 2. The flowchart is described as follows:

Step 600: Start.

Step 605: Enter the compress test mode and respectively write the test data $D_1$ and $D_2$ into the storage blocks 210 and 212 in the memory device 200 by the compress test operation so that the first time written test data $D_1'$ and $D_2'$ is stored in the storage blocks 210 and 212 respectively.

Step 610: Switch to the read with write back test mode from the compress test mode to respectively read the first time written test data $D_1'$ and $D_2'$ from the storage blocks 210 and 212 through the data read paths in the memory device 200 and to write the first time written test data $D_1'$ and $D_2'$ into the storage blocks 210 and 212 again through the data write paths for generating the second time written test data $D_1''$ and $D_2''$.

Step 615: Switch to the compress test mode from the read with write back test mode to read the second time written test data $D_1''$ and $D_2''$ from the storage blocks 210 and 212 by the compress test operation.

Step 620: Utilize the test circuit 214 to compare the second time written test data $D_1''$ and $D_2''$ with the test data $D_1$ and $D_2$ respectively to decide whether an error arises in the memory device 200.

Step 625: End.

Moreover, in another embodiment, the stress equipment can also directly input a test data into the memory device 200 via the electronic PAD 204 shown in FIG. 2. Under this condition, the data generators 258 and 260 and the MUX 248 are optional and therefore can be excluded from the memory device 200; the memory device 200 is still able to proceed with a test. Of course, in the embodiment of the present invention, the operation in the read with write back test mode can also be repeated at least one time, for continuously performing a burn-in process upon the memory device 200 for several hours. All these modifications fall within the scope of the present invention.

Those skilled in the art will readily observe that numerous modifications and alterations of the device and method may be made while retaining the teachings of the invention.

What is claimed is:

1. A memory device, comprising:
   a first storage block;
   a first PAD;
   a first reading and writing circuit, coupled to the first storage block and the first PAD, for reading data from the first storage block or writing data into the first storage block; the first reading and writing circuit having a first data read path and a first data write path;
   a second storage block;
   a second PAD;
   a second reading and writing circuit, coupled to the second storage block and the second PAD, for reading data from the second storage block or writing data into the second storage block; the second reading and writing circuit having a second data read path and a second data write path;
   a test circuit, coupled to the first reading and writing circuit and the second reading and writing circuit, for determining whether an error arises in the memory device; where the second PAD or the test circuit write at least a test data into the first storage block and the second storage block through the first data write path and the second data write path so that a plurality of first time written test data are stored in the first storage block and the second storage block; the plurality of first time written test data including a first writing test data and a second writing test data stored in the first storage block and the second storage block; and
   a control circuit, coupled to the first reading and writing circuit and the second reading and writing circuit, for controlling the first data read path and the second data read path to selectively transmit data read from the first storage block and the second storage block into the test circuit, the first PAD, or the second PAD, and for controlling the first data write path and the second data write path to selectively write data from the test circuit, the first PAD, or the second PAD into the first storage block and the second storage block;
   wherein when the memory device switches to a read with write back test mode, the control circuit controls the first data read path and the second data read path to read the first writing test data and the second writing test data from the first storage block and the second storage block and controls the first data write path and the second data write path to write the first writing test data and the second writing test data into the first storage block and the second storage block through the first data write path and the second data write path to generate a plurality of second time written test data including a third writing test data and a fourth writing test data stored in the first storage block and the second storage block; and when the memory device switches to a compress test mode, the control circuit controls the first data read path and the second data read path to read the third writing test data and the fourth writing test data from the first storage block and the second storage block and then transmits the third writing test data and the fourth writing test data into the test circuit, and the test circuit performs a compress test operation to determine whether an error arises in the memory device according to the third writing test data and the fourth writing test data and the test data.

2. The memory device of claim 1, wherein the test circuit comprises:
   a first data generator, coupled to the first data write path and the second data write path, for generating the test data according to a command passing through the second PAD and the second data write path and for writing the test data into the first storage block through the first data write path; and
   a second data generator, coupled to the second data write path, for generating the test data according to the command and for writing the test data into the second storage block through the second data write path.

3. The memory device of claim 1, wherein in the read with write back test mode the control circuit controls the first data read path, the second data read path, the first data write path, and the second data write path so that the plurality of second time written test data are updated at least one time.

4. The memory device of claim 1, wherein the control circuit controls the first data read path and the second data read path to read the first writing test data and the second writing test data from the first storage block and the second storage block, and controls the first data write path and the second data write path to directly write the first writing test data and the second writing test data, read from the first storage block and the second storage block, into the first storage block and the second storage block through the first data write path and the second data write path to generate the plurality of second time written test data.

* * * * *